(12) United States Patent
Gim et al.

(10) Patent No.: US 11,738,299 B2
(45) Date of Patent: Aug. 29, 2023

(54) EXHAUST GAS PROCESSING SYSTEM INCLUDING ADSORBENT FOR SUPPRESSING POWDER-LIKE BYPRODUCT

(71) Applicant: SAMSUNG ELECTRONICS CO., LTD., Suwon-si (KR)

(72) Inventors: Suji Gim, Hwaseong-si (KR); Sunwoo Yook, Seoul (KR); Youngduk Ko, Nonsan-si (KR); Youngseok Roh, Suwon-si (KR); Seoyoung Maeng, Seoul (KR); Jongyong Bae, Hwaseong-si (KR); Jihnkoo Lee, Nonsan-si (KR); Jungjoon Pyeon, Hwaseong-si (KR); Jongha Hwang, Nonsan-si (KR)

(73) Assignees: SAMSUNG ELECTRONICS CO., LTD., Suwon-si (KR); PureSphere Co., Ltd., Nonsan-si (KR)

( * ) Notice: Subject to any disclaimer, the term of this patent is extended or adjusted under 35 U.S.C. 154(b) by 115 days.

(21) Appl. No.: 17/372,855

(22) Filed: Jul. 12, 2021

(65) Prior Publication Data

US 2022/0203290 A1 Jun. 30, 2022

(30) Foreign Application Priority Data

Dec. 24, 2020 (KR) .......... 10-2020-0182761

(51) Int. Cl.
*B01D 53/04* (2006.01)
*H01L 21/67* (2006.01)

(52) U.S. Cl.
CPC ..... *B01D 53/0454* (2013.01); *B01D 53/0438* (2013.01); *B01D 2253/102* (2013.01);
(Continued)

(58) Field of Classification Search
CPC .............. B01D 53/04; B01D 53/0407; B01D 53/0438; B01D 53/0454; B01D 53/30;
(Continued)

(56) References Cited

U.S. PATENT DOCUMENTS

| 6,197,119 B1 | 3/2001 | Dozoretz et al. |
| 6,361,607 B2 | 3/2002 | Dozoretz et al. |

(Continued)

FOREIGN PATENT DOCUMENTS

| JP | 4718141 B2 | 7/2011 |
| JP | 5133013 B2 | 1/2013 |

(Continued)

*Primary Examiner* — Frank M Lawrence, Jr.
(74) *Attorney, Agent, or Firm* — Lee IP Law, P.C.

(57) ABSTRACT

An exhaust gas processing system including a process chamber in which an exhaust gas is produced; an exhaust gas measurer receiving the exhaust gas and measuring a concentration of the exhaust gas; a solid producing gas processor receiving the exhaust gas and removing a solid producing gas contained in the exhaust gas; a gas supply supplying dilution and cooling gases to the solid producing gas processor; a processed gas measurer receiving, as a processed gas, the exhaust gas free of the solid producing gas and measuring a temperature of the processed gas and ingredients of the processed gas; and a controller receiving results of measurement of the concentration of the exhaust gas from the exhaust gas measurer and results of measurement of the temperature of the processed gas and the ingredients of the processed gas from the exhaust gas measurer and controlling the gas supply based on the measurement results.

20 Claims, 4 Drawing Sheets

(52) U.S. Cl.
CPC .. *B01D 2253/112* (2013.01); *B01D 2257/204* (2013.01); *B01D 2258/0216* (2013.01); *H01L 21/67017* (2013.01)

(58) Field of Classification Search
CPC ............ B01D 2251/30; B01D 2251/40; B01D 2251/606; B01D 2253/102; B01D 2253/112; B01D 2253/1122; B01D 2253/34; B01D 2253/3425; B01D 2257/2025; B01D 2257/204; B01D 2257/2042; B01D 2257/2045; B01D 2257/2047; B01D 2257/2066; B01D 2258/0216; C23C 16/4412; H01L 21/67017
USPC .................. 96/109, 111, 112, 121, 131, 132

See application file for complete search history.

(56) References Cited

U.S. PATENT DOCUMENTS

| | | | |
|---|---|---|---|
| 6,773,687 | B1 | 8/2004 | Hasegawa |
| 7,455,720 | B2 | 11/2008 | Gu |
| 7,488,374 | B2 | 2/2009 | Komatsu |
| 7,972,649 | B2 | 7/2011 | Hirata |
| 10,036,090 | B2 | 7/2018 | Komori et al. |
| 2008/0124670 | A1 | 5/2008 | Jansen |
| 2011/0020544 | A1 | 1/2011 | Matsumoto |
| 2012/0024152 | A1* | 2/2012 | Yamawaki ......... B01D 53/0438 95/96 |
| 2022/0205094 | A1* | 6/2022 | Gim .................. B01D 53/8696 |

FOREIGN PATENT DOCUMENTS

| | | |
|---|---|---|
| JP | 6007715 B2 | 10/2016 |
| KR | 10-0714801 B1 | 5/2007 |
| KR | 10-0964320 B1 | 6/2010 |

* cited by examiner

EXHAUST GAS PROCESSING SYSTEM INCLUDING ADSORBENT FOR SUPPRESSING POWDER-LIKE BYPRODUCT

CROSS-REFERENCE TO THE RELATED APPLICATION

Korean Patent Application No. 10-2020-0182761, filed on Dec. 24, 2020 in the Korean Intellectual Property Office, and entitled: "Exhaust Gas Processing System Including Adsorbent For Suppressing Powder-Like Byproduct," is incorporated by reference herein in its entirety.

BACKGROUND

1. Field

Embodiments relate to an exhaust gas processing system including an adsorbent for processing an exhaust gas capable of producing a powder-like byproduct.

2. Description of the Related Art

A deposition process, which is one of semiconductor manufacturing processes, may be a process for depositing a thin film on a wafer through chemical reaction in a chamber under the condition that a process gas is injected into the chamber. A part of the process gas forms the thin film on the wafer through the chemical reaction, and a remaining part of the process gas may flow to a discharge line in an unreacted state.

SUMMARY

The embodiments may be realized by providing an exhaust gas processing system including a process chamber in which a process for a semiconductor is performable and in which an exhaust gas is producible; an exhaust gas measurer connected to the process chamber, the exhaust gas measurer being configured to receive the exhaust gas from the process chamber and to measure a concentration of the exhaust gas; a solid producing gas processor connected to the exhaust gas measurer, the solid producing gas processor being configured to receive the exhaust gas from the exhaust gas measurer and to remove a solid producing gas contained in the exhaust gas; a gas supply connected to the solid producing gas processor, the gas supply being configured to supply a dilution gas and a cooling gas to the solid producing gas processor; a processed gas measurer connected to the solid producing gas processor, the processed gas measurer being configured to receive, as a processed gas, the exhaust gas free of the solid producing gas from the solid producing gas processor and to measure a temperature of the processed gas and ingredients of the processed gas; and a controller connected to the exhaust gas measurer, the processed gas measurer, the solid producing gas processor, and the gas supply, the controller being configured to receive measurement results of the concentration of the exhaust gas from the exhaust gas measurer and measurement results of the temperature of the processed gas and the ingredients of the processed gas from the exhaust gas measurer and to control the gas supply based on the measurement results.

The embodiments may be realized by providing an exhaust gas processing system including a process chamber in which a process for a semiconductor is performable and in which an exhaust gas is producible; a first solid producing gas processor connected to the process chamber, the first solid producing gas processor being configured to receive the exhaust gas from the process chamber and to remove at least a part of a solid producing gas contained in the exhaust gas; a second solid producing gas processor connected to the first solid producing gas processor, the second solid producing gas processor being configured to receive the exhaust gas free of the at least part of the solid producing gas from the first solid producing gas processor and to remove a remaining part of the solid producing gas contained in the exhaust gas through adsorption; and a processed gas measurer connected to the second solid producing gas processor, the processed gas measurer being configured to receive, as a processed gas, the exhaust gas free of the solid producing gas from the second solid producing gas processor and to measure a temperature of the processed gas and ingredients of the processed gas.

The embodiments may be realized by providing an exhaust gas processing system including a process chamber in which a process for a semiconductor is performable and in which an exhaust gas is producible; an exhaust gas measurer connected to the process chamber, the exhaust gas measurer being configured to receive the exhaust gas from the process chamber and to measure a concentration of the exhaust gas; a solid producing gas processor connected to the exhaust gas measurer, the solid producing gas processor being configured to receive the exhaust gas from the exhaust gas measurer and to remove a solid producing gas contained in the exhaust gas; a gas supply connected to the solid producing gas processor, the gas supply being configured to supply a dilution gas and a cooling gas to the solid producing gas processor; a processed gas measurer connected to the solid producing gas processor, the processed gas measurer being configured to receive, as a processed gas, the exhaust gas free of the solid producing gas from the solid producing gas processor and to measure a temperature of the processed gas and ingredients of the processed gas; and a controller connected to the exhaust gas measurer, the processed gas measurer, the solid producing gas processor, and the gas supply, the controller being configured to receive measurement results of the concentration of the exhaust gas from the exhaust gas measurer and measurement results of the temperature of the processed gas and the ingredients of the processed gas from the processed gas measurer and to control the gas supply based on the measurement results, wherein the solid producing gas processor includes an adsorbent configured to adsorb the solid producing gas, thereby removing the solid producing gas, and supports respectively at opposite ends of the adsorbent, to support the adsorbent, the adsorbent includes a carbonate adsorbent represented by $M_2CO_3$, in which "M" is an alkali metal, an alkali earth metal, or a transition metal, a volatile organic compound adsorbent, or a halogen adsorbent, and each of the supports is includes a metal mesh.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
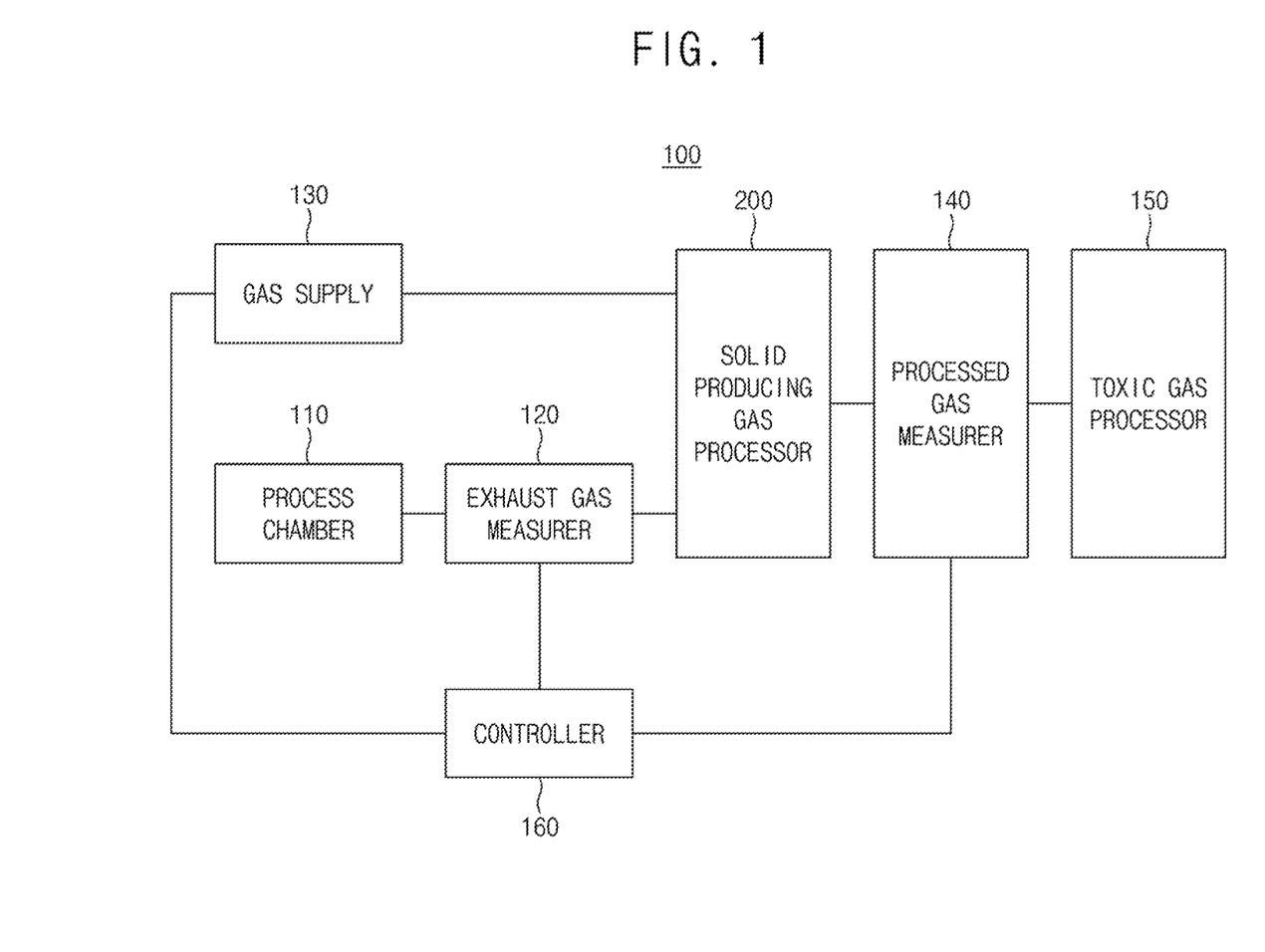
FIG. 1 is a diagram of an exhaust gas processing system according to an exemplary embodiment of the disclosure.

FIG. 1 is a diagram of an exhaust gas processing system according to an exemplary embodiment of the disclosure.

Referring to FIG. 1, an exhaust gas processing system 100 may include a process chamber 110, an exhaust gas measurement device or exhaust gas measurer 120, a gas supply 130, a solid producing gas processing device or a solid producing gas processor 200, a processed gas measurement device or a processed gas measurer 140, a toxic gas processing device or a toxic gas processor 150, and a controller 160.

The process chamber 110 may include a space in which a process for a wafer is performable. The process chamber 110 may receive a process gas from a process gas supply. A part of the process gas may perform a process for or on a wafer through chemical reaction thereof with a precursor. In an implementation, the process for the wafer may be a deposition process.

In accordance with execution of the process for the wafer, a part of the process gas may remain in the process chamber 110, as unreacted gas. The precursor may also remain in the process chamber 110, as unreacted gas. In an implementation, waste gas may be produced in accordance with chemical reaction. The unreacted gas, the precursor, and the waste gas may form exhaust gas.

When the exhaust gas is classified in terms of characteristics thereof, the exhaust gas may include a solid producing gas or a toxic gas. The solid producing gas may include a chemical material including Si, Ti, Hf, Zr, W, or Cu as a central atom (e.g., metal or metalloid), and H, a halogen-group element, an organic ligand, or the like coupled to the central atom around the central atom. In an implementation, the solid producing gas may include, e.g., $MR^1(N(R^2)_2)_3$, $SiH_2Cl_2$, $SiH_4$, $SiCl_4$, $NH_3$, tetraethyl orthosilicate (TEOS), $TiCl_4$, HCl, HBr, or HF. In an implementation, "M" may be, e.g., a heavy metal, "$R^1$" may be, e.g., a cyclic compound, and "$R^2$" may be, e.g., alkyl amine. As used herein, the term "or" is not an exclusive term, e.g., "A or B" would include A, B, or A and B.

The solid producing gas may include, e.g., a powder source gas, a volatile organic gas, or a polymer source gas. The powder source gas may be a gas forming a powder or powder-like byproduct through reaction thereof with another gas or reactant in the exhaust gas processing system 100. In an implementation, the powder source gas may include $NH_3$, TEOS, or $TiCl_4$. The volatile organic gas may include a volatile organic compound. In an implementation, the volatile organic gas may include, e.g., benzene, formaldehyde, toluene, xylene, ethylene, styrene, acetaldehyde, or the like. The polymer source gas may be a gas accelerating solidification of a monomer through polymerization. In an implementation, the monomer may include, e.g., $X(OEt)_4$, $X(OX)_4$, or $X(OH)_4$, in which "X" may include, e.g., Si, Ti, or Zr. Such a solid producing gas may be accumulated in a line in the exhaust gas processing system 100 and, as such, could degrade performance of the exhaust gas processing system 100.

In an implementation, when a deposition process is performed in the process chamber 110, using $TiCl_4$ as a process gas, a solid producing gas may include $TiCl_4$ or HCl, and a toxic gas may include $ClF_3$, HF, HBr, $NF_3$, HCl, $Cl_2$, or ClF. When a deposition process is performed in the process chamber 110, using tetraethyl orthosilicate (TEOS) as a process gas, a solid producing gas may include HCl or HF, and a toxic gas may include $ClF_3$, HF, HBr, $NF_3$, HCl, $Cl_2$, or ClF.

The exhaust gas measurer 120 may be connected to the process chamber 110 and the solid producing gas processor 200 by lines. The exhaust gas measurer 120 may be connected to the controller 160. In an implementation, a pump may be at or in the line connecting the exhaust gas measurer 120 and the process chamber 110. The pump may suck an exhaust gas from the process chamber 110, and may supply the exhaust gas to the exhaust gas measurer 120. The exhaust gas measurer 120 may measure the concentration of the exhaust gas. The exhaust gas measurer 120 may send results of concentration measurement to the controller 160.

The gas supply 130 may be connected to the solid producing gas processor 200 via a line. The gas supply 130 may be connected to the controller 160. The gas supply 130 may store an active gas. The active gas may include a dilution gas or a cooling gas. In an implementation, the dilution gas may include Ar, He, or $H_2$, and the cooling gas may include an inactive gas, $N_2$, or clean dry air (CDA).

The solid producing gas processor 200 may be connected to the exhaust gas measurer 120, the gas supply 130, and the processed gas measurer 140 via lines (e.g., the solid producing gas processor 200 may be indirectly connected to the controller 160 via the exhaust gas measurer 120, the gas supply 130, and the processed gas measurer 140). In an implementation, a pump may be provided at or in the line connecting the solid producing gas processor 200 and the exhaust gas measurer 120. The pump may suck an exhaust gas from the exhaust gas measurer 120, and may supply the exhaust gas to the solid producing gas processor 200.

The solid producing gas processor 200 may receive an active gas from the gas supply 130. When the active gas includes a dilution gas, the concentration of the exhaust gas in the solid producing gas processor 200 may be reduced by the dilution gas.

The solid producing gas processor 200 may be configured to perform processing of the exhaust gas, thereby producing a first processed gas. The solid producing gas processor 200 may perform processing of the exhaust gas in a manner of removing a solid producing gas from the exhaust gas. In an implementation, the processed gas may be an exhaust gas free of a solid producing gas. In an implementation, the solid producing gas processor 200 may include an adsorbent and may remove a solid producing gas in a manner of adsorbing the solid producing gas. Removal of the sold producing gas by the solid producing gas processor 200 may be achieved by an exothermic reaction. In an implementation, reaction heat according to the exothermic reaction may be 5 to 500 kJ/mol. In an implementation, the temperature of the solid producing gas processor 200 may increase during removal of the solid producing gas in an adsorption manner in the solid producing gas processor 200. The solid producing gas processor 200 may reduce the temperature thereof by receiving a cooling gas from the gas supply 130. The processed gas measurer 140 may be connected to the solid producing gas processor 200 and the toxic gas processor 150 via lines. The processed gas measurer 140 may be connected to the controller 160. The processed gas measurer 140 may receive the processed gas from the solid producing gas processor 200.

The processed gas measurer 140 may be configured to measure the temperature of the processed gas. In an implementation, the processed gas measurer 140 may include a temperature sensor. The processed gas measurer 140 may be configured to determine the temperature of the solid producing gas processor 200, based on the temperature of the processed gas. In an implementation, a temperature sensor may be in an interior of the solid producing gas processor 200 and the temperature of the processed gas or the temperature of the solid producing gas processor 200 may be measured. In an implementation, the temperature of the processed gas measurer 140 may be omitted.

The processed gas measurer 140 may be configured to measure ingredients of the processed gas. In an implementation, the processed gas measurer 140 may include a mass spectroscopy device, a gas chromatography device, a thermal conductivity detector, a flame ionization detector, or a Fourier-transform infrared spectroscopy (FT-IR) device and may be configured to measure ingredients of the processed gas. The processed gas measurer 140 may send results of measurement of the temperature of the processed gas and the ingredients of the processed gas to the controller 160.

The toxic gas processor 150 may be connected to the processed gas measurer 140. The toxic gas processor 150 may be configured to receive the processed gas from the processed gas measurer 140. The toxic gas processor 150 may include, e.g., a wet scrubber, a dry scrubber, a burn-wet scrubber, or a wet-burn scrubber, and may be configured to remove a toxic gas in a manner of adsorbing the toxic gas. The toxic gas processor 150 may be configured to remove the toxic gas from the processed gas, and may be configured to then outwardly discharge the removed toxic gas. The controller 160 may be connected to the exhaust gas measurer 120, the gas supply 130, and the processed gas measurer 140. The controller 160 may be configured to receive the results of measurement of the concentration of the exhaust gas from the exhaust gas measurer 120. The controller 160 may be configured to receive the results of measurement of the temperature of the processed gas and/or the ingredients of the processed gas from the processed gas measurer 140.

The controller 160 may be configured to control the gas supply 130, based on the results of measurement of the concentration of the exhaust gas and the results of measurement of the temperature of the processed gas or the ingredients of the processed gas. The controller 160 may be configured to measure a processing rate of the solid producing gas processor 200 for the solid producing gas, based on the results of measurement of the ingredients of the processed gas, and may be configured to determine whether an abnormality of the solid producing gas processor 200 has occurred, based on the measured processing rate.

Figure 2:
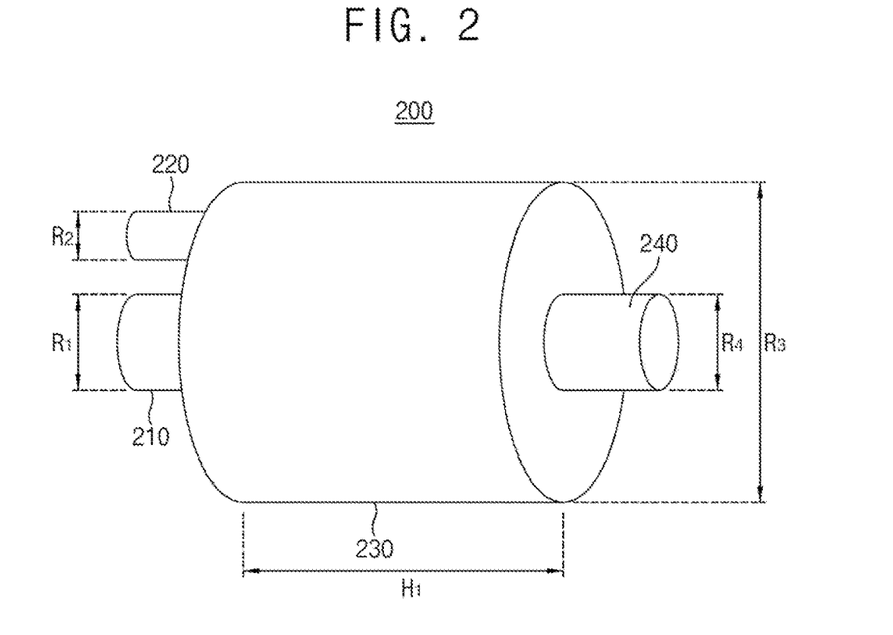
FIG. 2 is a perspective view of a solid producing gas processor according to an exemplary embodiment of the disclosure.
Figure 3:
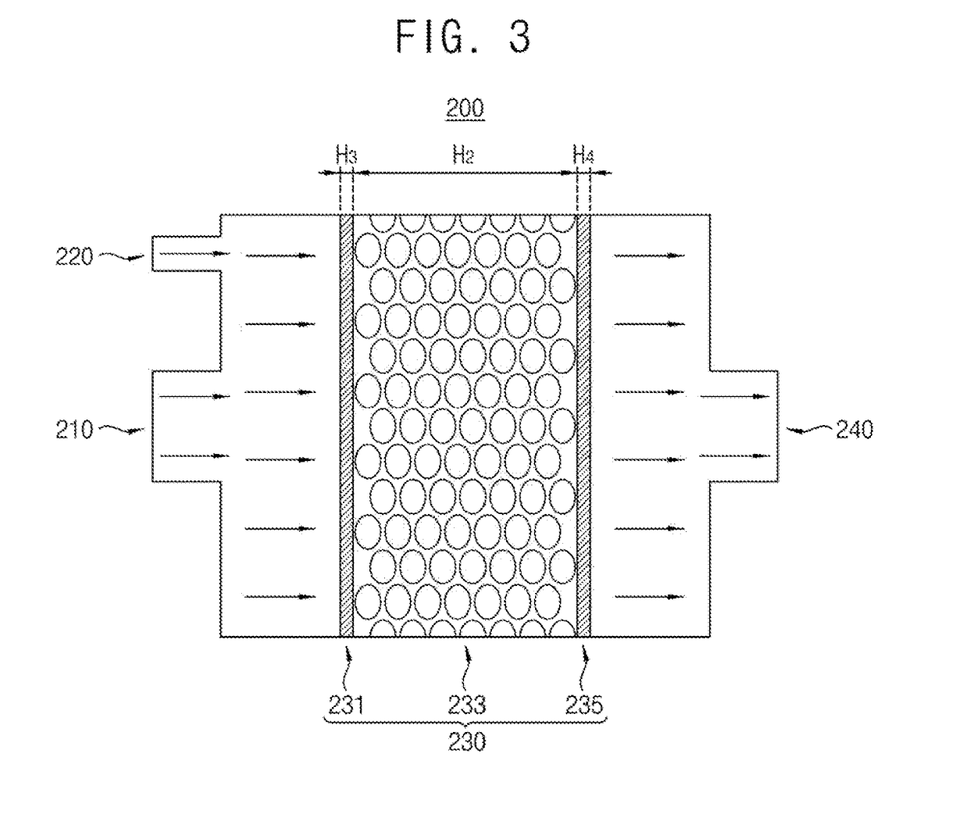
FIG. 3 is a sectional view of the solid producing gas processor according to the exemplary embodiment of the disclosure.

FIG. 2 is a perspective view of the solid producing gas processor according to an exemplary embodiment of the disclosure. FIG. 3 is a sectional view of the solid producing gas processor according to the exemplary embodiment of the disclosure.

Referring to FIGS. 2 and 3, the solid producing gas processor 200 may include an exhaust gas inlet 210, an active gas inlet 220, an exhaust gas processor 230, and an outlet 240. The exhaust gas inlet 210 may be at an upstream end of the solid producing gas processor 200. The exhaust gas inlet 210 may receive an exhaust gas from the exhaust gas measurer 120.

The active gas inlet 220 may be at the upstream end of the solid producing gas processor 200. The active gas inlet 220 may be spaced apart from the exhaust gas inlet 210. The active gas inlet 220 may receive an active gas from the gas supply 130.

In an implementation, as illustrated in the drawing, the exhaust gas inlet 210 and the active gas inlet 220 may have a cylindrical shape having a circular cross-section, or the cross-sections of the exhaust gas inlet 210 and the active gas inlet 220 may have other suitable shapes, e.g., a triangular shape, a quadrangular shape, or the like. In an implementation, diameters $R_1$ and $R_2$ of the cross-sections of the exhaust gas inlet 210 and the active gas inlet 220 may each independently be, e.g., 40 mm to 60 mm.

The exhaust gas processor 230 may be at a central portion of the sold producing gas processor 200. The exhaust gas processor 230 may be connected, at an upstream end thereof, to the exhaust gas inlet 210 and the active gas inlet 220 while being connected, at a downstream end thereof, to the outlet 240. In an implementation, the exhaust gas processor 230 may have a cylindrical shape having a circular cross-section, or the cross-section of the exhaust gas processor 230 may have other suitable shapes, e.g., a triangular shape, a quadrangular shape, or the like. In an implementation, a diameter $R_3$ of the exhaust gas processor 230 may be, e.g., 280 mm to 320 mm. In an implementation, a thickness $H_1$ of the exhaust gas processor 230 may be, e.g., 270 mm to 290 mm.

The outlet 240 may be at a downstream end of the solid producing gas processor 200. In an implementation, the outlet 240 may have a cylindrical shape having a circular cross-section, or the cross-section of the outlet 240 may have other suitable shapes, e.g., a triangular shape, a quadrangular shape, or the like. In an implementation, a diameter $R_4$ of the outlet 240 may be, e.g., 40 mm to 60 mm. The outlet 240 may be connected to the downstream end of the exhaust gas processor 230. The outlet 240 may receive a processed gas from the exhaust gas processor 230.

The exhaust gas processor 230 may be configured to receive an exhaust gas and an active gas from the exhaust gas inlet 210 and the active gas inlet 220, respectively. The exhaust gas and the active gas may be mixed at the upstream end of the exhaust gas processor 230. In an implementation, when the active gas includes a dilution gas, the exhaust gas and the dilution gas may be mixed in the exhaust gas processor 230 and, as such, the concentration of the exhaust gas is reduced. When the active gas includes a cooling gas, the exhaust gas and the cooling gas are mixed in the exhaust gas processor 230 and, as such, the temperature of the exhaust gas may be reduced.

The exhaust gas processor 230 may include an adsorbent 231, a first support 233, and a second support 235. The adsorbent 231 may be at a central portion of the exhaust gas processor 230. The adsorbent 231 may have a structure in which the ingredients of the adsorbent 231 are pelletized or a structure in which the ingredients of the adsorbent 231 are supported by a support. In an implementation, the support may include, e.g., $SiO_2$, $Al_2O_3$, $ZnO_2$, $TiO_2$, $SiO_2$—$Al_2O_3$, or $CeO_2$.

In an implementation, the adsorbent 231 may have, e.g., a spherical shape, a honeycomb shape, a 3H pellet shape, or a 4H pellet shape. In an implementation, a thickness H2 of the adsorbent 231 may be, e.g., 160 mm to 240 mm.

An adsorption capacity of the adsorbent 231 may be determined based on the concentration of the exhaust gas, adsorption time, and the temperature of the sold producing gas processor 200. The adsorption capacity may be a maximum capacity of the adsorbent 231 capable of adsorbing a solid producing gas.

The adsorbent 231 may adsorb a solid producing gas contained in the exhaust gas. In an implementation, when the adsorbent 231 is a carbonate adsorbent represented by $M_2CO_3$, the adsorbent 231 may adsorb a solid producing gas of TiCl$_4$ or HCl. In an implementation, "M" may include, e.g., an alkali metal, an alkali earth metal, or a transition metal. In an implementation, "M" may include, e.g., Li, Na, Ca, Mg, Ba, Rb, Zn, Al, Fe, Cu, Ni, or Ce. In an implementation, when the adsorbent 231 includes a volatile organic compound adsorbent, the adsorbent 231 may adsorb a solid producing gas component which is a volatile organic gas. In an implementation, the volatile organic compound adsorbent may include, e.g., activated carbon, carbon nanotube, zeolite, a metal-organic framework (MOF), alumina, silica, or the like, which may include a microporous structure.

When the adsorbent 231 includes a halogen adsorbent, the adsorbent 231 may adsorb a solid producing gas which is a polymer source gas. In an implementation, the polymer source gas may include HCl or HF. In an implementation, the halogen adsorbent may include, e.g., activated carbon, carbon nanotube, zeolite, a metal-organic framework (MOF), alumina, silica, or the like, which may include a microporous structure, and may include an oxide including Zn, Mn, Ag or Cu. In an implementation, when the adsorbent 231 includes a halogen adsorbent, the adsorbent 231 may be used in a state of being mixed with a base material or in a state of being ion-exchanged with a metal material in order to enhance the adsorption force thereof.

When the adsorbent 231 adsorbs a solid producing gas, a solid may be produced at the adsorbent 231, as an adsorption reaction product, and a processed gas may be produced. In an implementation, when the adsorbent 231 adsorbs TiCl$_4$ or HCl, MCl, which is a solid, may be produced as an adsorption reaction product. In an implementation, "M" may be, e.g., Li, Na, Ca, Rb, Zn, Al, Fe, Cu, or Ce.

The first support 233 may be at an upstream end of the adsorbent 231. The first support 233 may help prevent leakage of an adsorption reaction product through an upstream end of the first support 233. In an implementation, a pressure buffer may be at the upstream end of the first support 233. The pressure buffer may help maintain the pressure of the adsorbent 231.

The second support 235 may be at a downstream end of the adsorbent 231. The second support 235 may be connected or adjacent to the outlet 240. The second support 235 may receive the processed gas from the adsorbent 231. The second support 235 may help prevent leakage of an adsorption reaction product through a downstream end of the second support 235.

The first support 233 and the second support 235 may support the adsorbent 231. Thicknesses H3 and H4 of the first support 233 and the second support 235 may each independently be, e.g., 8 mm to 12 mm. In an implementation, each of the first support 233 and the second support 235 may be, e.g., a metal mesh.

Figure 4:
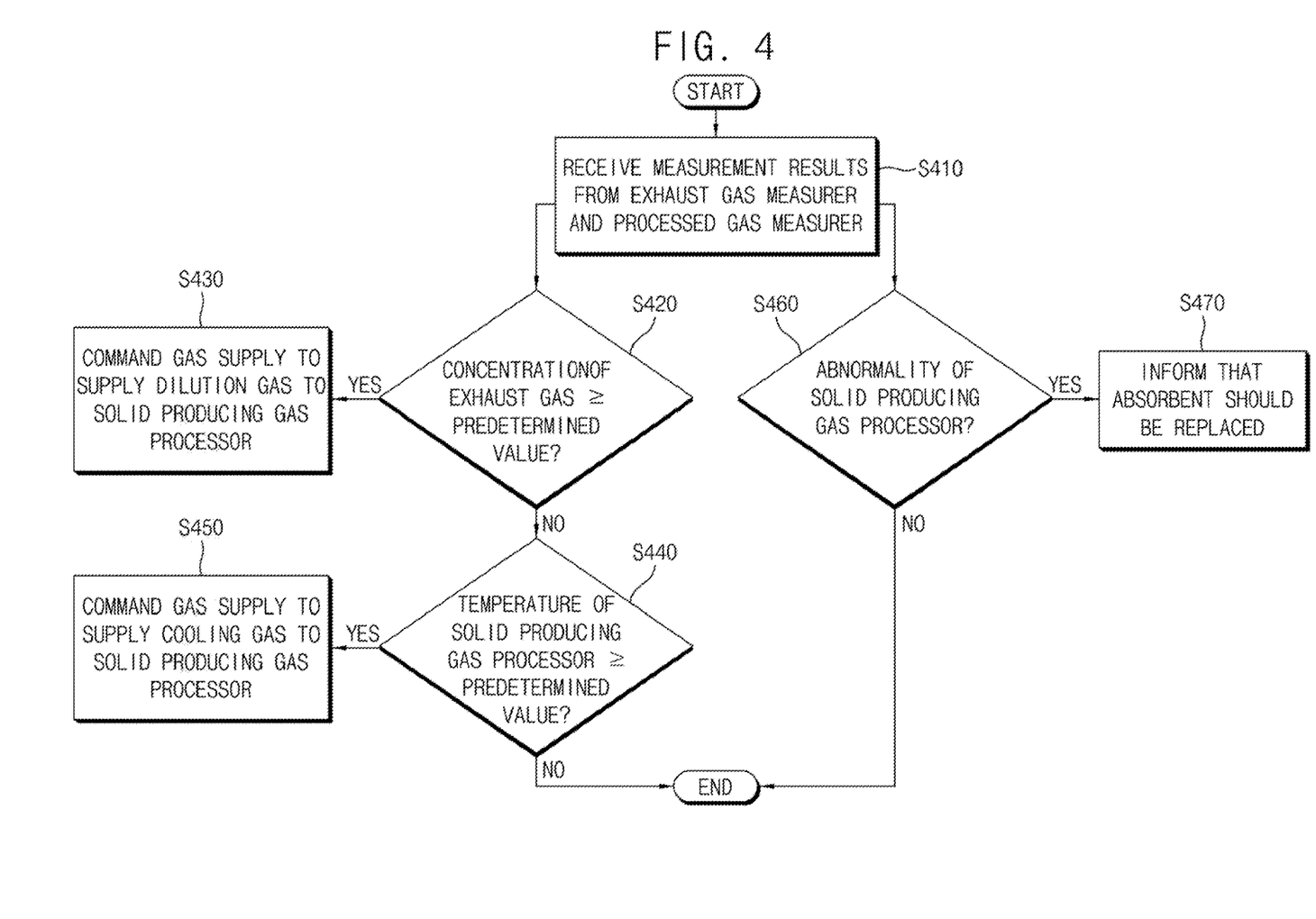
FIG. 4 is a flowchart of an exhaust gas processing method according to an exemplary embodiment of the disclosure.

FIG. 4 is a flowchart of an exhaust gas processing method according to an exemplary embodiment of the disclosure.

Referring to FIGS. 1 and 4, the controller 160 may receive measurement results from the exhaust gas measurer 120 and the processed gas measurer 140 (S140). The controller 160 may receive measurement results for the concentration of an exhaust gas from the exhaust gas measurer 120. The controller 160 may receive measurement results for the ingredients of the processed gas and/or the temperature of the processed gas from the processed gas measurer 140.

The controller 160 may determine whether the concentration of the exhaust gas is not less than a predetermined concentration (S420). In an implementation, the predetermined concentration may be, e.g., 1 ppm to 100,000 ppm. When the concentration of the exhaust gas is not less than the predetermined concentration (e.g., "YES" in S420), the controller 160 may command the gas supply 130 to supply a dilution gas to the solid producing gas processor 200 (S430).

In an implementation, when the concentration of the exhaust gas is less than the predetermined concentration (e.g., "NO" in S420), the controller 160 may determine whether the temperature of the solid producing gas processor 200 is not less than a predetermined temperature. The controller 160 may determine the temperature of the solid producing gas processor 200, based on measurement results for the temperature of the processed gas. The controller 160 may determine whether the temperature of the solid producing gas processor 200 is not less than the predetermined temperature. The predetermined temperature may vary in accordance with operating conditions of the solid producing gas processor 200. The operating conditions may be operating conditions according to the kind of the adsorbent 231 included in the solid producing gas processor 200.

In an implementation, when the temperature of the solid producing gas processor 200 is not less than the predetermined temperature (e.g., "YES" in S440), the controller 160 may command the gas supply 130 to supply a cooling gas to the solid producing gas processor 200 (S450). In an implementation, when the temperature of the exhaust gas is less than the predetermined temperature (e.g., "NO" in S440), the controller 160 ends the control.

The controller 160 may determine whether an abnormality of the solid producing gas processor 200 has occurred (S460). The controller 160 may determine the processing rate of the solid producing gas processor 200 for a solid producing gas, based on measurement results for the ingredients of the processed gas. In an implementation, when the processing rate is less than a predetermined value, the controller 160 may determine that the use capacity of the adsorbent 231 has become excessive. The use capacity of the adsorbent 231 may be varied in accordance with reaction temperature, adsorption capacity and the kind of the solid producing gas.

Upon determining that the use capacity of the adsorbent 231 has become excessive, the controller 160 may determine that an abnormality of the sold producing gas processor 200 has occurred (e.g., "YES" in S460). The predetermined value may be varied in accordance with operating conditions of the solid producing gas processor 200. Upon determining that abnormality of the solid producing gas processor 200 has occurred, the controller 160 may inform that the adsorbent 231 should be replaced (S470). Upon determining that there is no abnormality of the solid producing gas processor 200, the controller 160 may end the control (e.g., "NO" in S460).

Figure 5:
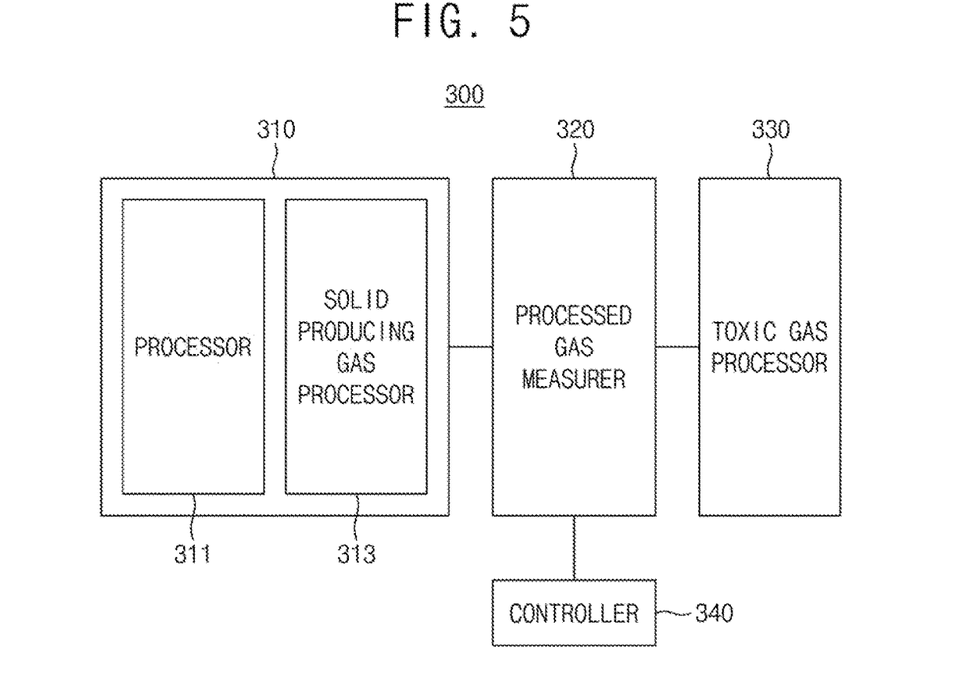
FIG. 5 is a diagram of an exhaust gas processing system according to an exemplary embodiment of the disclosure.

FIG. 5 is a diagram of an exhaust gas processing system according to an exemplary embodiment of the disclosure.

Referring to FIG. 5, an exhaust gas processing system 300 may include a process chamber 310, a processed gas measurer 320, a toxic gas processor 330, and a controller 340. The processed gas measurer 320 and the toxic gas processor 330 may be identical to the processed gas measurer 140 and the toxic gas processor 150 of FIG. 1.

The process chamber 310 may include a processor 311 and a solid producing gas processor 313. There may be no separate line between the processor 311 and the solid producing gas processor 313.

The processor 311 may perform a process for or on a semiconductor in the same manner as that of the process chamber 110 of FIG. 1. An exhaust gas may be generated in the processor 311. The exhaust gas generated in the processor 311 may be introduced into the solid producing gas processor 313. The solid producing gas processor 313 may be configured to remove a solid producing gas contained in the exhaust gas. The solid producing gas processor 313 may be configured to remove the solid producing gas in a manner of adsorbing the solid producing gas.

The controller 340 may receive results of measurement of the ingredients and temperature of a processed gas from the processed gas measurer 320. The controller 340 may determine whether an abnormality of the solid producing gas processor 313 has occurred, based on measurement results. In an implementation, when the controller 340 determines that an abnormality of the solid producing gas processor 200 has occurred, an adsorbent of the solid producing gas processor 213 may be replaced.

Figure 6:
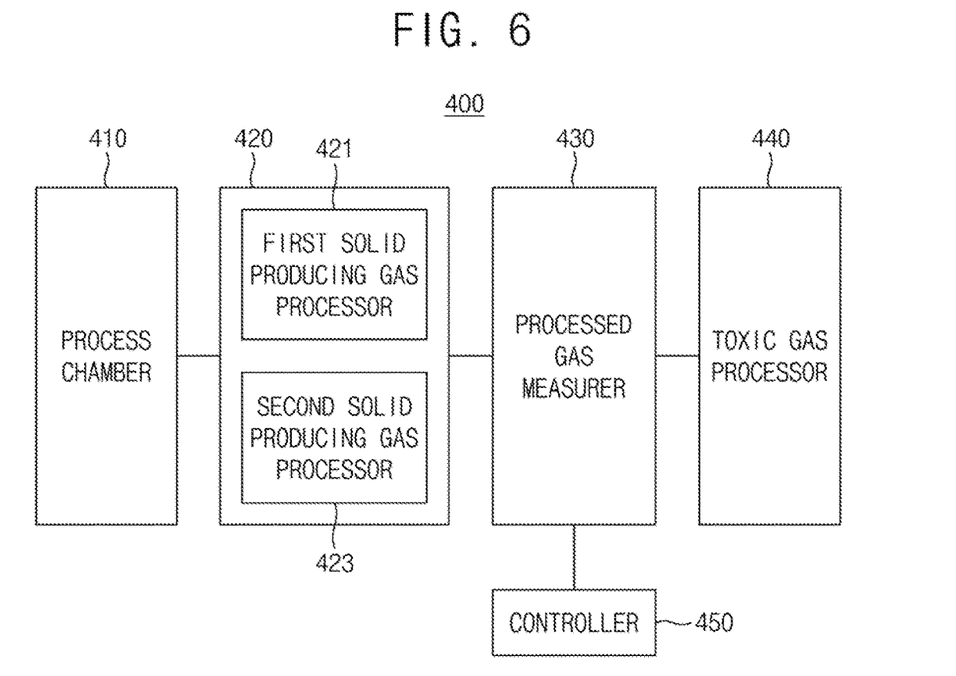
FIG. 6 is a diagram of an exhaust gas processing system according to an exemplary embodiment of the disclosure.

FIG. 6 is a diagram of an exhaust gas processing system according to an exemplary embodiment of the disclosure.

Referring to FIG. 6, an exhaust gas processing system 400 may include a process chamber 410, a solid producing gas processor 420, a processed gas measurer 430, a toxic gas processor 440, and a controller 450. The processed gas measurer 430, the toxic gas processor 440, and the controller 450 may be identical to the processed gas measurer 320, the toxic gas processor 330, and the controller 340 of FIG. 5.

The solid producing gas processor 420 may include a first solid producing gas processor 421 and a second solid producing gas processor 423. The first solid producing gas processor 421 may be connected to the process chamber 410 and the second solid producing gas processor 423 via lines. The first solid producing gas processor 421 may be configured to receive an exhaust gas from the process chamber 410. The first solid producing gas processor 421 may be configured to perform processing for a solid producing gas contained in the exhaust gas.

In an implementation, the first solid producing gas processor 421 may be a powder removal device. In this case, a least a part of the solid producing gas contained in the exhaust gas may be solidified in the first solid producing gas processor 421 and, as such, powder may be formed. The first solid producing gas processor 421 may collect the formed powder.

The first solid producing gas processor 421 may be a plasma device. In an implementation, the first solid producing gas processor 421 may form plasma. The first solid producing gas processor 421 may be configured to perform processing for at least a part of the solid producing gas contained in the exhaust gas, using the plasma.

The second solid producing gas processor 423 may be configured to receive, from the first solid producing gas processor 421, the exhaust gas in a state in which at least a part of the solid producing gas contained in the exhaust gas has been processed. The second solid producing gas processor 423 may be identical to the solid producing gas processor 313 of FIG. 5. The second solid producing gas processor 423 may be configured to adsorb the solid producing gas contained in the exhaust gas and, as such, may remove the solid producing gas.

By way of summation and review, a portion of the unreacted process gas may produce a powder-like process byproduct through a chemical reaction thereof in the discharge line. The powder-like process byproduct could be accumulated on an inner surface of the line. Such an accumulated process byproduct could reduce the inner diameter of the line and, as such, flow of an exhaust gas could be obstructed, and the efficiency of the semiconductor manufacturing process could be degraded.

In accordance with the exemplary embodiments of the disclosure, it may be possible to achieve smooth flow of a gas in an exhaust gas processing system by removing a solid producing gas, using an adsorbent, before solidification of the solid producing gas.

One or more embodiments may provide an exhaust gas processing system including an adsorbent capable of preventing degradation in efficiency of a semiconductor manufacturing process, e.g., which could otherwise occur due to formation of a process byproduct in the semiconductor manufacturing process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. An exhaust gas processing system, comprising:
a process chamber in which a process for a semiconductor is performable and in which an exhaust gas is producible;
an exhaust gas measurer connected to the process chamber, the exhaust gas measurer being configured to receive the exhaust gas from the process chamber and to measure a concentration of the exhaust gas;
a solid producing gas processor connected to the exhaust gas measurer, the solid producing gas processor being configured to receive the exhaust gas from the exhaust gas measurer and to remove a solid producing gas contained in the exhaust gas;
a gas supply connected to the solid producing gas processor, the gas supply being configured to supply a dilution gas and a cooling gas to the solid producing gas processor;
a processed gas measurer connected to the solid producing gas processor, the processed gas measurer being configured to receive, as a processed gas, an exhaust gas free of the solid producing gas from the solid producing gas processor and to measure a temperature of the processed gas and ingredients of the processed gas; and
a controller connected to the exhaust gas measurer, the processed gas measurer, the solid producing gas processor, and the gas supply, the controller being configured to receive measurement results of the concentration of the exhaust gas from the exhaust gas measurer and measurement results of the temperature of the processed gas and the ingredients of the processed gas from the processed gas measurer and to control the gas supply based on the measurement results.

2. The exhaust gas processing system as claimed in claim 1, wherein:
the solid producing gas includes $MR^1(N(R^2)_2)_3$, $SiH_2Cl_2$, $SiH_4$, $SiCl_4$, $NH_3$, tetraethyl orthosilicate, $TiCl_4$, HCl, HBr, or HF, and
"M" is a heavy metal, "$R^1$" is a cyclic compound, and "$R^2$" is alkyl amine.

3. The exhaust gas processing system as claimed in claim 1, wherein the solid producing gas processor includes:
an adsorbent configured to adsorb the solid producing gas and remove the solid producing gas; and
supports respectively at opposite ends of the adsorbent and configured to support the adsorbent.

4. The exhaust gas processing system as claimed in claim 3, wherein the adsorbent includes:
a carbonate adsorbent represented by $M_2CO_3$, in which "M" is an alkali metal, an alkali earth metal, or a transition metal,
a volatile organic compound adsorbent; or
a halogen adsorbent.

5. The exhaust gas processing system as claimed in claim 3, wherein the adsorbent has a spherical shape, a honeycomb shape, or a pellet shape.

6. The exhaust gas processing system as claimed in claim 3, wherein each of the supports includes a metal mesh.

7. The exhaust gas processing system as claimed in claim 1, wherein the controller is further configured to command the gas supply to further supply the dilution gas to the solid producing gas processor when the concentration of the exhaust gas is greater than a predetermined concentration.

8. The exhaust gas processing system as claimed in claim 7, wherein the predetermined concentration is 1 ppm to 100,000 ppm.

9. The exhaust gas processing system as claimed in claim 1, wherein the controller is further configured to:
determine a temperature of the solid producing gas processor based on the measurement results for the temperature of the processed gas, and
command the gas supply to further supply the cooling gas to the solid producing gas processor when the temperature of the solid producing gas processor is not less than a predetermined temperature.

10. The exhaust gas processing system as claimed in claim 1, wherein the controller is further configured to:
determine a processing rate of the solid producing gas processor based on the measurement results for the ingredients of the processed gas, and
determine whether an abnormality of the solid producing gas processor has occurred, based on the processing rate.

11. The exhaust gas processing system as claimed in claim 10, wherein the controller is further configured to determine whether an adsorbent included in the solid producing gas processor should be replaced, based on whether there an abnormality of the solid producing gas processor has occurred.

12. The exhaust gas processing system as claimed in claim 1, wherein the processed gas measurer includes a mass spectroscopy device, a gas chromatography device, a thermal conductivity detector, a flame ionization detector, or a Fourier-transform infrared spectroscopy (FT-IR) device.

13. The exhaust gas processing system as claimed in claim 1, further comprising a toxic gas processor connected to the processed gas measurer, the toxic gas processor being configured to receive the processed gas from the processed gas measurer and to remove a toxic gas contained in the processed gas.

14. The exhaust gas processing system as claimed in claim 13, wherein the toxic gas processor includes a wet scrubber, a dry scrubber, a burn-wet scrubber, or a wet-burn scrubber.

15. The exhaust gas processing system as claimed in claim 13, wherein the toxic gas includes $ClF_3$, HF, HBr, $NF_3$, HCl, $Cl_2$, or ClF.

16. An exhaust gas processing system, comprising:
a process chamber in which a process for a semiconductor is performable and in which an exhaust gas is producible;
a first solid producing gas processor connected to the process chamber, the first solid producing gas processor being configured to receive the exhaust gas from the process chamber and to remove at least a part of a solid producing gas contained in the exhaust gas;
a second solid producing gas processor connected to the first solid producing gas processor, the second solid producing gas processor being configured to receive an exhaust gas free of the at least part of the solid producing gas from the first solid producing gas processor and to remove a remaining part of the solid producing gas contained in the exhaust gas through adsorption; and
a processed gas measurer connected to the second solid producing gas processor, the processed gas measurer being configured to receive, as a processed gas, the exhaust gas free of the solid producing gas from the second solid producing gas processor and to measure a temperature of the processed gas and ingredients of the processed gas.

17. The exhaust gas processing system as claimed in claim 16, wherein, when at least a part of the solid producing gas is solidified, thereby producing a powder, the first solid producing gas processor is further configured to collect the powder, thereby removing the at least part of the solid producing gas.

18. The exhaust gas processing system as claimed in claim 16, wherein the first solid producing gas processor is further configured to remove the at least part of the solid producing gas using plasma.

19. An exhaust gas processing system, comprising:
a process chamber in which a process for a semiconductor is performable and in which an exhaust gas is producible;
an exhaust gas measurer connected to the process chamber, the exhaust gas measurer being configured to receive the exhaust gas from the process chamber and to measure a concentration of the exhaust gas;
a solid producing gas processor connected to the exhaust gas measurer, the solid producing gas processor being configured to receive the exhaust gas from the exhaust gas measurer and to remove a solid producing gas contained in the exhaust gas;
a gas supply connected to the solid producing gas processor, the gas supply being configured to supply a dilution gas and a cooling gas to the solid producing gas processor;
a processed gas measurer connected to the solid producing gas processor, the processed gas measurer being configured to receive, as a processed gas, an exhaust gas free of the solid producing gas from the solid producing gas processor and to measure a temperature of the processed gas and ingredients of the processed gas; and
a controller connected to the exhaust gas measurer, the processed gas measurer, the solid producing gas processor, and the gas supply, the controller being configured to receive measurement results of the concentration of the exhaust gas from the exhaust gas measurer and measurement results of the temperature of the processed gas and the ingredients of the processed gas from the processed gas measurer and to control the gas supply based on the measurement results, wherein:
the solid producing gas processor includes an adsorbent configured to adsorb the solid producing gas, thereby removing the solid producing gas, and supports respectively at opposite ends of the adsorbent, to support the adsorbent,
the adsorbent includes:
a carbonate adsorbent represented by $M_2CO_3$, in which "M" is an alkali metal, an alkali earth metal, or a transition metal,
a volatile organic compound adsorbent, or
a halogen adsorbent, and
each of the supports is includes a metal mesh.

20. The exhaust gas processing system as claimed in claim 19, wherein the controller is further configured to:
command the gas supply to further supply the dilution gas to the solid producing gas processor when the concentration of the exhaust gas is more than a predetermined value,
determine a temperature of the solid producing gas processor based on the measurement results for the temperature of the processed gas,
command the gas supply to further supply the cooling gas to the solid producing gas processor when the temperature of the solid producing gas processor is not less than a predetermined temperature,
determine a processing rate of the solid producing gas processor based on the measurement results for the ingredients of the processed gas, and
determine whether an abnormality of the solid producing gas processor has occurred, based on the processing rate.

* * * * *